(12) United States Patent
Oh et al.

(10) Patent No.: US 8,736,546 B2
(45) Date of Patent: May 27, 2014

(54) DISPLAY DEVICE

(75) Inventors: Il-Soo Oh, Yongin (KR); Chang-Ho Lee, Yongin (KR); Hee-Joo Ko, Yongin (KR); Hyung-Jun Song, Yongin (KR); Se-Jin Cho, Yongin (KR); Jin-Young Yun, Yongin (KR); Bo-Ra Lee, Yongin (KR); Young-Woo Song, Yongin (KR); Jong-Hyuk Lee, Yongin (KR); Sung-Chul Kim, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 146 days.

(21) Appl. No.: 13/213,509

(22) Filed: Aug. 19, 2011

(65) Prior Publication Data
US 2012/0287108 A1 Nov. 15, 2012

(30) Foreign Application Priority Data

May 13, 2011 (KR) ........................ 10-2011-0045337

(51) Int. Cl.
*G09G 3/34* (2006.01)

(52) U.S. Cl.
USPC ............................. 345/107; 345/87; 349/113

(58) Field of Classification Search
None
See application file for complete search history.

(56) References Cited

U.S. PATENT DOCUMENTS

| 6,621,541 | B1 * | 9/2003 | Choi ............................. 349/113 |
| 7,034,911 | B2 | 4/2006 | Kato |
| 2004/0252076 | A1 | 12/2004 | Kodama |
| 2006/0193031 | A1 * | 8/2006 | Moore ............................ 359/296 |
| 2010/0182552 | A1 * | 7/2010 | Park et al. ..................... 349/114 |
| 2010/0253671 | A1 * | 10/2010 | Perry et al. .................... 345/212 |
| 2012/0026434 | A1 * | 2/2012 | Chen ............................ 349/106 |

FOREIGN PATENT DOCUMENTS

| JP | 4496713 B2 | 4/2010 |
| KR | 10-2002-0027936 A | 4/2002 |
| KR | 10-0656718 B1 | 12/2006 |

* cited by examiner

*Primary Examiner* — Seokyun Moon
(74) *Attorney, Agent, or Firm* — Lee & Morse, P.C.

(57) ABSTRACT

A display device includes a display panel configured to display an image in an upward direction and a reflective panel on the display panel, the reflective panel configured to selectively transmit or reflect light with respect to an area corresponding to the image.

7 Claims, 5 Drawing Sheets

DISPLAY DEVICE

RELATED APPLICATIONS

This application claims priority to and the benefit of Korean Patent Application No. 10-2011-0045337 filed in the Korean Intellectual Property Office on May 13, 2011, the entire contents of which are incorporated herein by reference.

BACKGROUND

1. Field

Embodiments relate to a display device. More particularly, embodiments relate to a display device in which a plurality of panels is layered.

2. Description of the Related Art

A display device displays an image. A display device may include a plurality of panels having respectively different functions.

SUMMARY

Embodiments may be directed to a display device including a display panel configured to display an image in an upward direction, and a reflective panel on the display panel and selectively transmitting or reflecting light with respect to an area corresponding to the image.

The display panel may include a phase delay plate and a polarizing plate that are sequentially layered in the upward direction on a path through which the image is displayed.

The display panel may include a plurality of pixels for forming the image, and a non-pixel area between neighboring pixel areas among a plurality of pixel areas.

The reflective panel may include: a first transparent electrode corresponding to a pixel area; a neighboring electrode that neighbors the first transparent electrode and corresponds to the non-pixel area; a second transparent electrode corresponding to the pixel area, the second transparent electrode being arranged opposite to the first transparent electrode; a space being interposed between the first transparent electrode and the second transparent electrode; and charged particles in the space, the charged particles reflecting light.

When an electric field is applied to the first transparent electrode and the second transparent electrode, the charged particles may be located in a second transparent electrode side corresponding to the first transparent electrode and the second transparent electrode.

When an electric field is applied to the neighboring electrode and the second transparent electrode, the charged particles may be located in a neighboring electrode side corresponding to the neighboring electrode and the second transparent electrode.

The display panel may further include an organic light emitting element that emits light corresponding to a pixel area to form the image.

DETAILED DESCRIPTION

Figure 1:
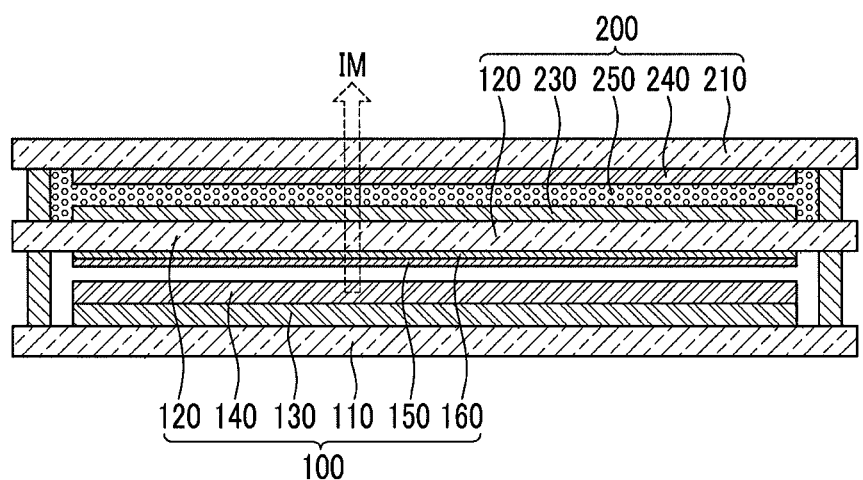
FIG. 1 is a cross-sectional view of a display device according to an exemplary embodiment.

Example embodiments will now be described more fully hereinafter with reference to the accompanying drawings; however, they may be embodied in different forms and should not be construed as limited to the embodiments set forth herein.

The drawings and description are to be regarded as illustrative in nature and not restrictive. Like reference numerals designate like elements throughout the specification.

In the drawings, the size and thickness of each element is approximately shown for better understanding and ease of description. Therefore, present embodiments are not limited to the drawings.

In the drawings, the thickness of layers, films, panels, regions, etc., are exaggerated for clarity. Further, in the drawings, the thicknesses of layers and regions are exaggerated for better understanding and ease of description. It will be understood that when an element, i.e., a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element and does not imply being necessarily positioned on the top on the basis of a gravity direction.

Hereinafter, a display device according to an exemplary embodiment will be described with reference to FIG. 1 to FIG. 5.

FIG. 1 is a cross-sectional view of the display device according to the exemplary embodiment.

As shown in FIG. 1, the display device according to the exemplary embodiment includes a display panel 100 and a reflective panel 200.

The display panel 100 displays an image IM in an upward direction, and the image IM selectively passes through the reflective panel 200. The display panel 100 includes a first substrate 110, a second substrate 120, a driving circuit 130, an organic light emitting element 140, a phase delay plate 150, and a polarizing plate 160.

The first substrate 110 may be formed of an insulation substrate made of glass, quartz, ceramic, plastic, etc. Alternatively, the first substrate 110 may be formed of a metallic substrate made of stainless steel.

The second substrate 120 is arranged opposite to the first substrate 110, and covers the organic light emitting element 140 and the driving circuit 130. The second substrate 120 is formed of a transparent material, i.e., glass, quartz, and plastic.

In the display device according to the exemplary embodiment, the second substrate 120 is disposed at a predetermined distance from the organic light emitting element 140, but a second substrate of a display device according to another exemplary embodiment may be a thin film encapsulation layer deposited on an organic light emitting element.

The driving circuit 130 and the organic light emitting element 140 formed on the first substrate 110 are disposed between the first substrate 110 and second substrate 120.

The driver 130 includes a switching thin film transistor 10 and a driving thin film transistor 20 (shown in FIG. 2), and drives the organic light emitting element 140. The organic light emitting element 140 emits light according to a driving signal transmitted from the driver 130 to display the image IM in an upward direction.

Figure 2:
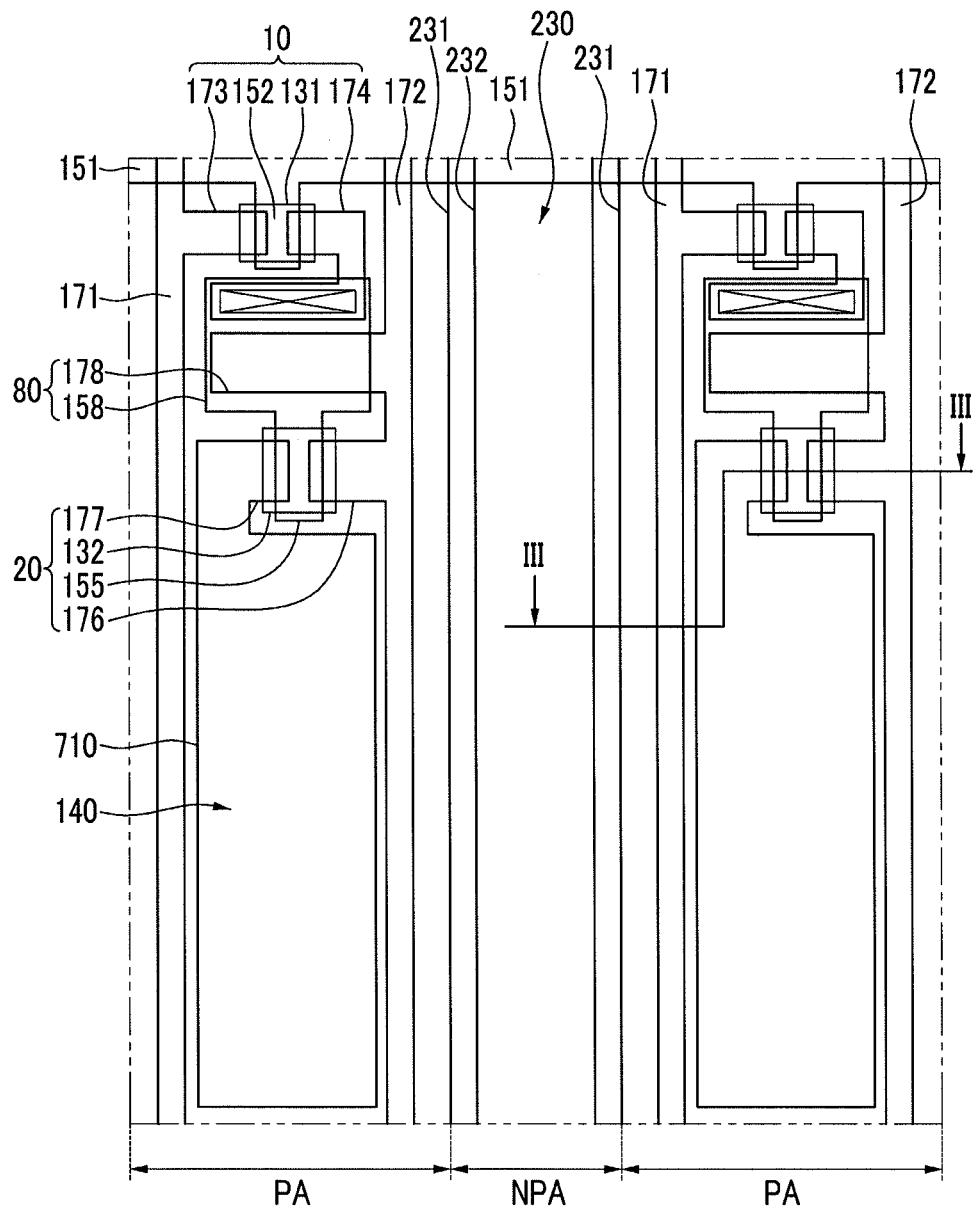
FIG. 2 shows a pixel structure of the display device according to the exemplary embodiment.
Figure 3:
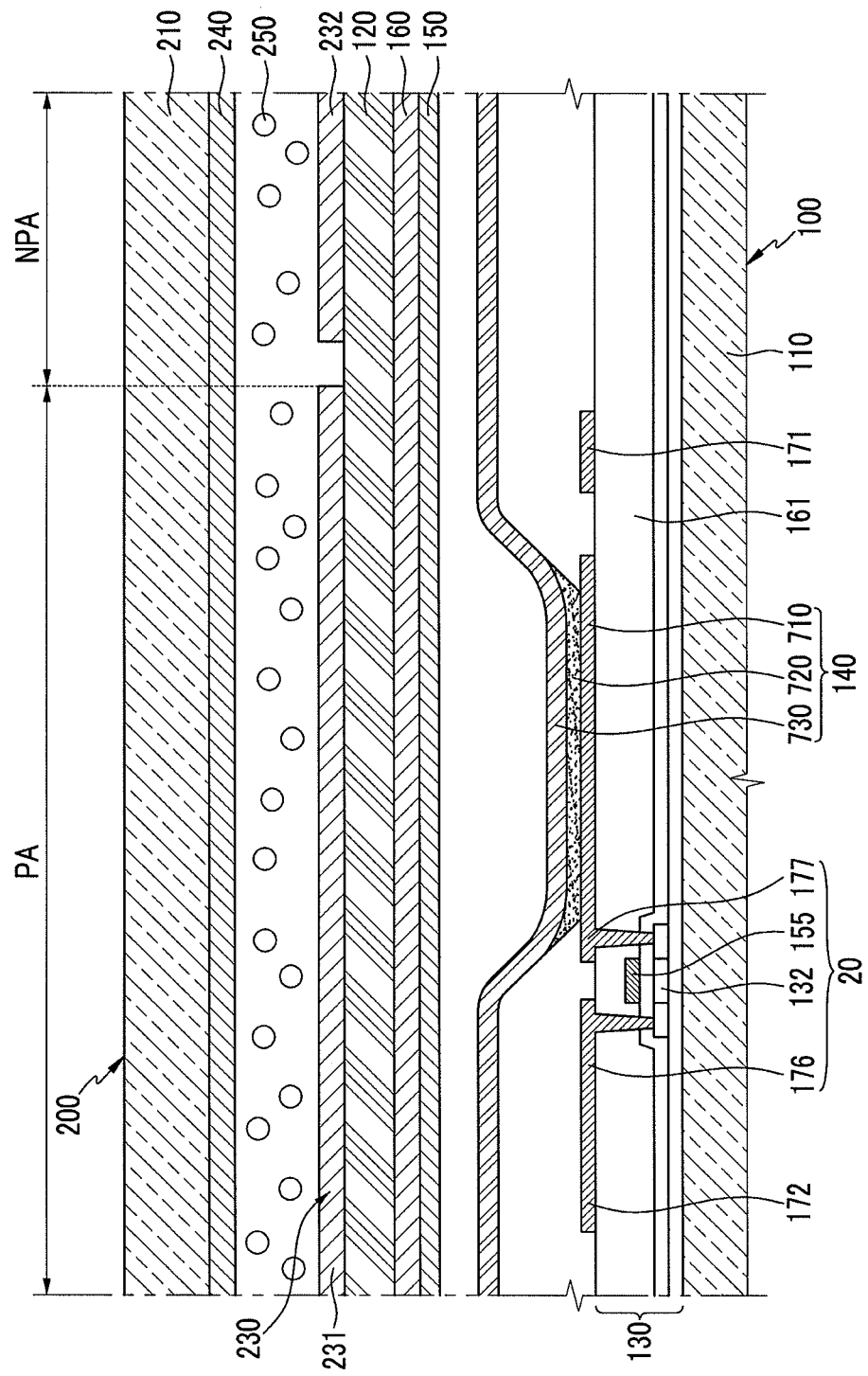
FIG. 3 is a cross-sectional view of FIG. 2, taken along the line

The entire structure of the organic light emitting element 140 and the driver 130 is shown in FIG. 2 and FIG. 3, but the organic light emitting element 140 and the driver 130 may be variously modified within a range known to a person skilled in the art.

Hereinafter, an internal structure of the display panel 100 will be described in further detail with reference to FIG. 2 and FIG. 3.

FIG. 2 is a layout view of a pixel structure of the display device according to the exemplary embodiment. FIG. 3 is a cross-sectional view of FIG. 2, taken along the line III-III.

As shown in FIG. 2 and FIG. 3, the display panel 100 includes the switching thin film transistor 10, the driving thin film transistor 20, a capacitor 80, and the organic light emitting diode (OLED) 140 formed in each pixel. Here, the driver 130 is configured with the switching thin film transistor 10, the driving thin film transistor 20, and the capacitor 80. The driver 130 further includes gate lines 151 arranged along one direction of the first substrate 110, data lines 171, and common power lines 172. The data lines 171 and the common power lines 172 cross the gate lines 151 in an insulated manner. Here, a pixel area PA that is a minimum unit for displaying an image IM is defined by the boundary of a gate line 151, a data line 171, and a common power line 172, and a plurality of pixel areas PA form an image IM. Further, a non-pixel area NPA is disposed between neighboring pixel areas PA along the plurality of pixel areas PA.

In the display device according to the exemplary embodiment, one pixel PA is defined by the boundary of the gate line 151, the data line 171, and the common power line 172, but a pixel area PA may be defined by any configuration that corresponds to a minimum unit displaying an image IM in a display device according to another exemplary embodiment.

The organic light emitting element 140 includes a first electrode 710, an organic emission layer 720 formed on the first electrode 710, and a second electrode 730 formed on the organic emission layer 720. Here, the first electrode 710 is an anode which is a hole injection electrode, and the second electrode 730 is a cathode which is an electron injection electrode. Alternatively, the first electrode 710 may be a cathode and the second electrode 730 may be an anode depending on a driving method of the display panel 100. Holes and electrodes are injected into the organic emission layer 720 respectively from the anode 710 and the cathode 730. When an exciton, in which a hole and an electron injected into the organic emission layer 720 are coupled to each other, falls from an excited state to a ground state, light emission occurs.

In the display panel 100 according to the exemplary embodiment, the organic light emitting element 140 emits light in a direction of the second substrate 120. In other words, the organic light emitting element 140 is a front emission type. For light emission of the organic light emitting element 140 in an upward direction, i.e., the direction of the second substrate 120, at least the second electrode 730 among the first and second electrodes 710 and 730 is formed of a light transmissive conductive material.

The capacitor 80 includes a pair of capacitor plates 158 and 178, arranged interposing an interlayer insulating layer 161 therebetween. Here, the interlayer insulating layer 161 is a dielectric material, and capacitance of the capacitor 80 is determined by charges charged in the capacitor 80 and a voltage between the two capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch to select a pixel for light emission. The switching gate electrode 152 is connected to the gate line 151. The switching source electrode 173 is connected to the data line 171. The switching drain electrode 174 is distanced from the switching source electrode 173 and is connected with the capacitor plate 158 of the two capacitor plates 158 and 178.

The driving thin film transistor 20 applies driving power to the second electrode 730 for light emission of an organic emission layer 720 of an organic light emitting element 140 of the selected pixel. The driving gate electrode 155 is connected with the capacitor plate 158 that is connected with the switching drain electrode 174. The driving source electrode 176 and the other capacitor plate 178 are respectively connected with the common power line 172. The driving drain electrode 177 is disposed at the same layer where the first electrode 710 is disposed, and is connected with the first electrode 710.

In the OLED display according to the exemplary embodiment, the driving drain electrode 177 and the first electrode 710 are disposed on the same layer, but a driving drain electrode of an OLED display according to another exemplary embodiment and a first electrode may be disposed in different layers and may access the first electrode through an opening formed in an insulating layer.

With such a structure, the switching thin film transistor 10 is driven by a gate voltage applied to the gate line 151 to transmit a data voltage applied to the data line 171 to the driving thin film transistor 20. A voltage corresponding to a difference between a common voltage applied to the driving thin film transistor 20 from the common power line 172 and the data voltage transmitted from the switching thin film transistor 10 is stored in the capacitor 80, and a current corresponding to the voltage stored in the capacitor 80 flows to the organic light emitting diode 30 through the driving thin film transistor 20 such that the organic light emitting diode 300 emits light, and the display panel 100 displays the image IM by the light emitted from the organic light emitting element 140.

The phase delay plate 150 and the polarizing plate 160 are sequentially layered in an upward direction on a path for displaying the image IM.

The phase delay plate 150 is disposed between the organic light emitting element 140 and the second substrate 120. The phase delay plate 150 delays the phase of light passing through the phase delay plate 150 by $\lambda/4$ to change the optical axis of the light. A polarizing plate 160 is disposed between the phase delay plate 150 and the second substrate 120.

The polarizing plate 160 is attached to the second substrate 120, together with the phase delay plate 150. The polarizing plate 160 linearly polarizes light passing therethrough, and functions to improve an image displayed from the organic light emitting element 140 by suppressing reflection of external light irradiated to the organic light emitting element 140 from the outside, together with the phase delay plate 150.

Meanwhile, in the display device according to the exemplary embodiment, the phase delay plate 150 and the polarizing plate 160 are attached to the second substrate 120 between the organic light emitting element 140 and the second substrate 120, but a phase delay plate and a polarizing plate of a display device according to another exemplary embodiment may be attached to a second substrate 120 between the second substrate 120 and a first transparent electrode 231.

Further, the display panel 100 of the display device according to the exemplary embodiment is exemplarily described as an organic light emitting display panel including the organic light emitting element 140, but a display panel of a display device according to another exemplary embodiment may be one of a liquid crystal display panel, a plasma display panel, a display panel where a plurality of light emitting diodes (LEDs) are arranged, and a field emission display panel.

Referring back to FIG. 1, the reflective panel 200 is disposed on the display panel 100.

The reflective panel 200 selectively transmits or reflects light with respect to an area corresponding to the image IM displayed from the display panel 100. The reflective panel 200 includes the second substrate 120, a third substrate 210, a driving electrode 230, a second transparent electrode 240, and charged particles 250.

The reflective panel 200 of the display device according to the exemplary embodiment shares the second substrate 120 with the display panel 100, but a reflective panel of a display device according to another exemplary embodiment may include another substrate formed on the second substrate 120.

The third substrate 210 is arranged opposite to the second substrate 120, and covers the driving electrode 230, the second transparent electrode 240, and the charged particles 250, together with the second substrate 120. The third substrate 210 is formed of a transparent material such as glass, quartz, plastic, etc. The second transparent electrode 240 is formed on the third substrate 210, and the driving electrode 230 is formed opposite to the second transparent electrode 240, interposing the charged particles 250 therebetween.

The driving electrode 230, the second transparent electrode 240, and the charged particles 250 will be described in further detail with reference to FIG. 2 and FIG. 3.

As shown in FIG. 2 and FIG. 3, the driving electrode 230 is disposed on the second substrate 120, and includes the first transparent electrode 231 and a neighboring electrode 232.

The first transparent electrode 231 corresponds to the pixel area PA of the display panel 100, and the neighboring electrode 232 neighbors the first transparent electrode 231 and corresponds to the non-pixel area NPA of the display panel 100. The first transparent electrode 231 and the neighboring electrode 232 respectively include a transparent conducting material, i.e., indium tin oxide (ITO) or indium zinc oxide (IZO). The first transparent electrode 231 and the neighboring electrode 232 are arranged opposite to the second transparent electrode 240, interposing a space where the charged particles 250 are located therebetween, and one of the first transparent electrode 231 and the neighboring electrode 232 forms an electric field to drive positive or negative charged particles 250, together with the second transparent electrode 240. At least one of the first transparent electrode 231 and the neighboring electrode 232 may receive a signal by a thin film transistor (not shown) and thus be selectively driven according to an active matrix (AM) method, or may receive a signal by a plurality of signals (not shown) that cross each other and thus be selectively driven according to a passive matrix (PM) method.

The second transparent electrode 240 is formed over the entire area of the third substrate 210 corresponding to the pixel area PA, and arranged opposite to the first transparent electrode 231 and the neighboring electrode 232, interposing the space where the charged particles 250 are located therebetween.

The charged particles 250 are disposed in the space between the second transparent electrode 240 and the driving electrode 230, and have a white color from reflection of light and are charged with one polarity. When the electric field is applied to the first and second transparent electrodes 231 and 240, the charged particles 250 are arranged along the second transparent electrode 240 side corresponding to the first and second transparent electrodes 231 and 240 such that the location of the charged particles 250 corresponds to the pixel area PA of the display panel 100. When the electric field is applied to the neighboring electrode 232 and the second transparent electrode 240, the charged particles 250 are arranged along the neighboring electrodes 232 side corresponding to the neighboring electrode 232 and the second transparent electrode 240 such that the location of the charged particles 250 corresponds to the non-pixel area NPA of the display panel 100. The charged particles 250 may be formed by coloring titanium oxide ($TiO_2$) or silicon oxide ($SiO_2$) with a pigment. The charged particles 250 may represent specific charges, may be charged using a charge control agent as stated above, or may be electrically charged while floating through a solvent. Here, the charge control agent may be a polymer or a non-polymer or ionic or non-ionic, and may be a sodium dodecylbenzene sulfonate, a metal soap, a polybutene succinimide, a maleic anhydride copolymer, a vinylpyridine copolymer, a vinylpyrrolidone copolymer, an acrylic (or methacrylic) acid copolymer, etc. The charged particles 250 may be dispersed in a fluid. The fluid may have a low viscosity for efficient movement of the charged particles 250 and a low dielectric constant for suppressing a chemical reaction. In addition, the fluid may be transparent, and may include a hydrocarbon, i.e., decahydronaphthalene, 5-ethylidene-2-norbordene, a fatty oil, and coal oil, an aromatic hydrocarbon, i.e., toluene, xylene, phenyl xylylethane, dodecylbenzene, and alkyl naphthalene, and a halogenated solvent, i.e., perfluorodecalin, perfluortoluene, perfluoroxylene, dichlorobenzotrifluoride, 3,4,5-trichclorobenzotrifluoride, chloropentafluoro-benzene, dichlorononane, and pentachlorobenzene. As described, the charged particles 250 are selectively located corresponding to the pixel area PA or the non-pixel area NPA. Accordingly the reflective panel 200 selectively transmits or reflects light with respect to the pixel area PA of the display panel 100.

The charged particles 250 of the reflective panel 200 according to the exemplary embodiment have a white color from reflection of light, but charged particles of a reflective panel according to another exemplary embodiment may have one of a black color, a red color, a green color, and a blue color from absorption or reflection of light.

Hereafter, a driving method of the display device according to the exemplary embodiment will be described with reference to FIG. 4 and FIG. 5. Here, the driving method depends on driving of the reflective panel 200 of the display panel 100.

Figure 4:
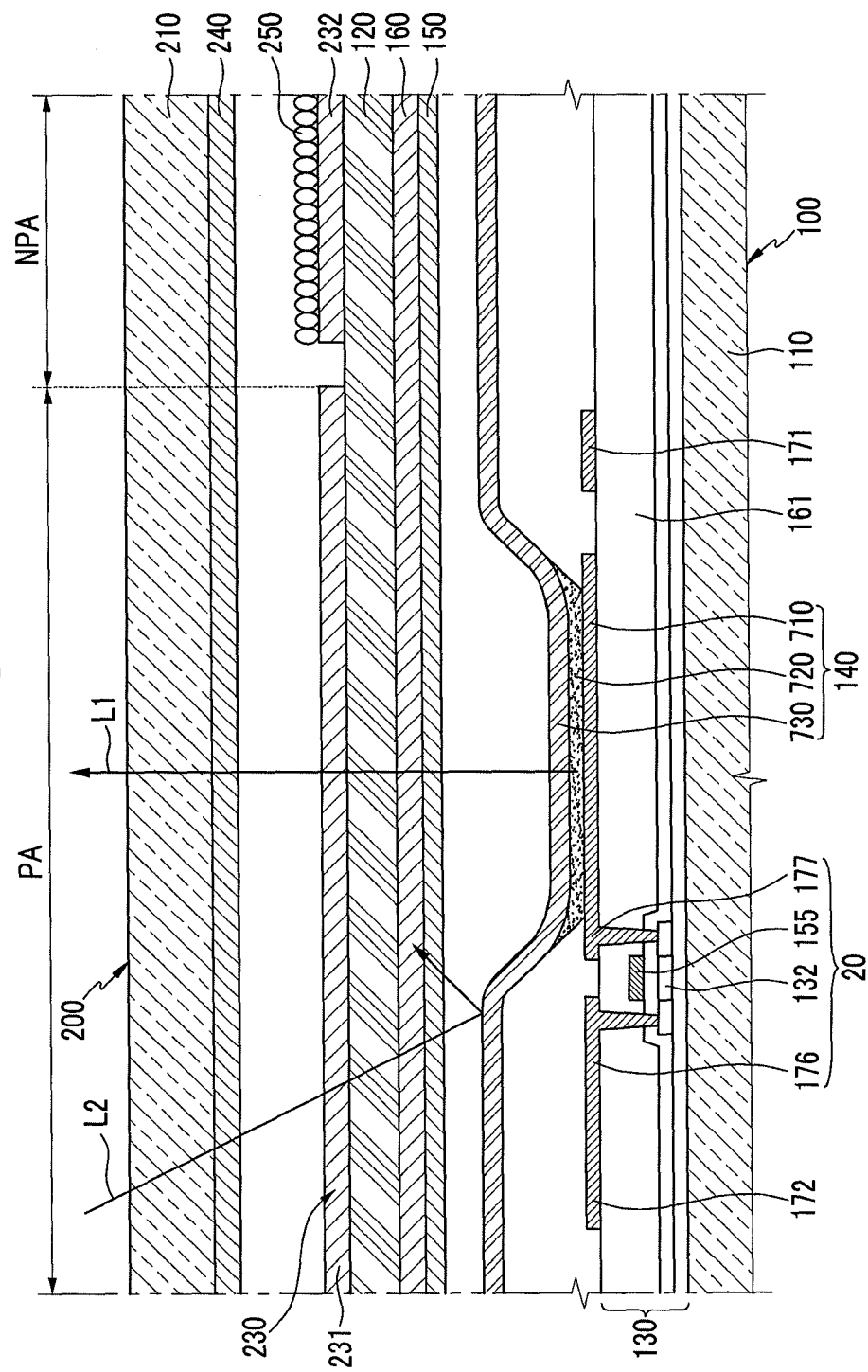
FIG. 4 and FIG. 5 are provided for describing a driving method of the display device according to the exemplary embodiment.
Figure 5:
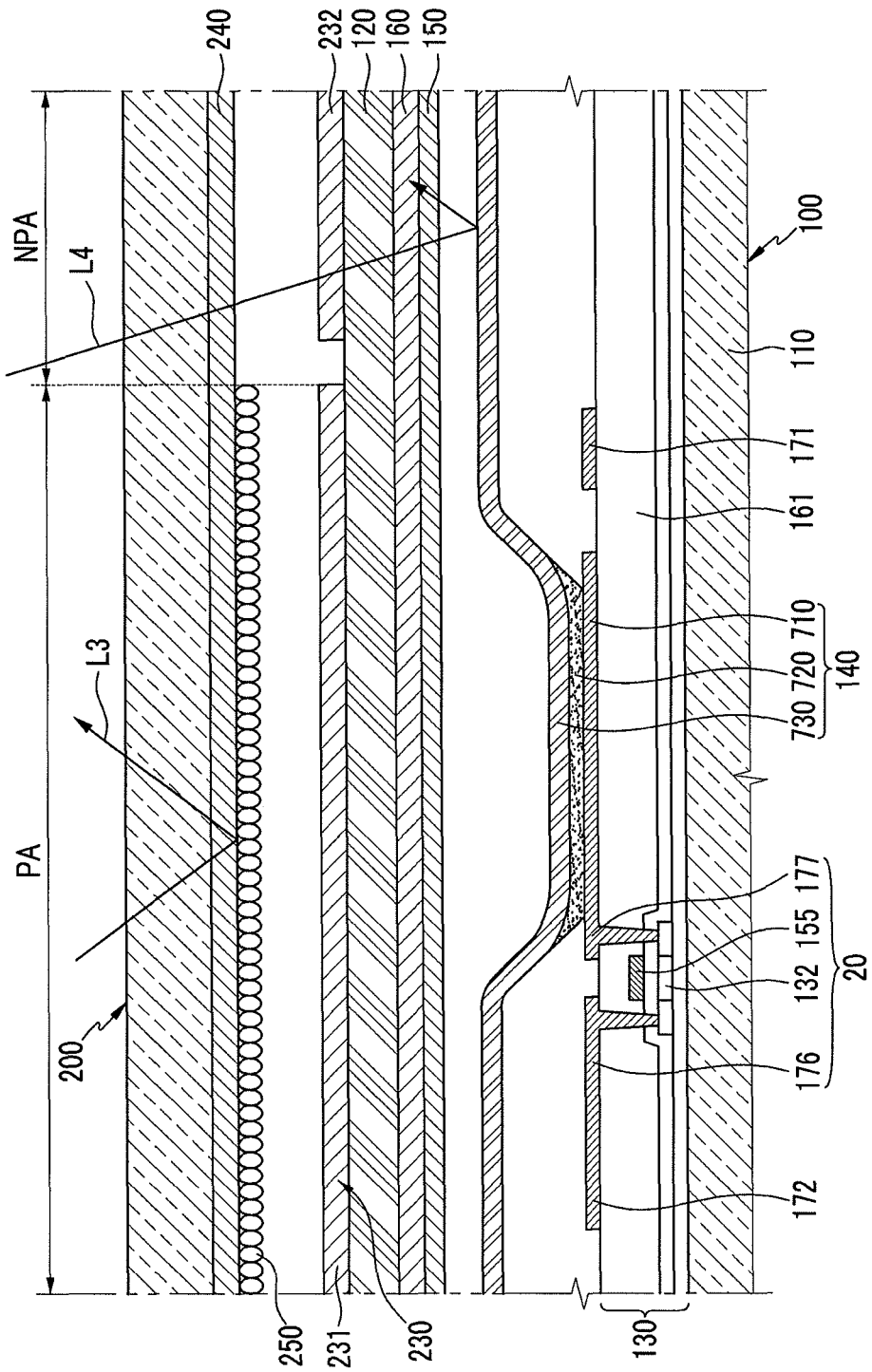

FIG. 4 and FIG. 5 are provided to describe the driving method of the display device according to the exemplary embodiment.

First, as shown in FIG. 4, in a first display mode, when an image is displayed only using the display panel 100, voltages having a potential difference (+, −) are respectively applied to the second transparent electrode 240 and the neighboring electrode 232 of the reflective panel 200 to generate an electric field therebetween. Thus, electrically positive or negative charged particles 250 move to the neighboring electrode 232 applied with a polarity that is opposite to that of the second transparent electrode 230 such that the charged particles 250 are located corresponding to the non-pixel area NPA of the display panel 100. Accordingly, the reflective panel 200 is driven in a mode in which light is transmitted with respect to the pixel area PA of the display panel 100. When the display panel 100 is driven in the first display mode, first light L1 generated from the organic emission layer 720 corresponding to the pixel area PA is transmitted through the reflective panel 200 and viewed at the outside such that a user can view the image IM displayed from the display panel 100. In particular, when the organic emission layer 720 generates light for each pixel area PA, the user can view a colorful image with light from the respective pixel areas PA.

As described, although the reflective panel 200 of the display device according to the exemplary embodiment is realized in a transmissive mode with respect to the pixel area PA, light emitted from the display panel 100 cannot transmit through particles such as liquid crystals while transmitting through the reflective panel 200. Accordingly, luminance deterioration can be suppressed.

Meanwhile, since second light L2, i.e., external light incident on the display panel 100 from the outside, is transmitted through the phase delay plate 150 and absorbed by the polarizing plate 160 even though the second light L2 is reflected by the organic light emitting element 14 after being transmitted through the polarizing plate 160 and the phase delay plate 150, reflection of the external light due to the display panel 100 can be suppressed.

As described, in the display device according to the exemplary embodiment, the phase delay plate 150 and the polarizing plate 160 are sequentially layered between the reflective panel 200 and the display panel 100 so that reflection of external light due to the display panel 100 can be suppressed.

As shown in FIG. 5, in a second display mode when an image is displayed using only the reflective panel 200, when voltages having a potential difference (+, −) are respectively applied to the first transparent electrode 231 and the second transparent electrode 240 of the reflective panel 200 to generate an electric field between the first transparent electrode 231 and the second transparent electrode 240. Thus, electrically positive or negative charged particles 250 move to the second transparent electrode 240 to which a voltage having the opposite polarity is applied to be located corresponding to the pixel area PA of the display panel 100 so that the reflective panel 200 is driven in a mode in which light is reflected with respect to the pixel area PA of the display panel 100. In this case, a user recognizes third light L3 that has been incident on the reflective panel 200 and then reflected by the charged particles 250. When the charged particles 250 move toward the second transparent electrode 240 so as to be closer to the user, the user clearly recognizes a color of the charged particles 250, and when the charged particles 250 move toward the first transparent electrode 231, the user cannot clearly recognize the color of the charged particles 250. Such a movement of the charged particles 250 is caused by electrophoresis. Accordingly, an image can be displayed only using the reflective panel 200.

Meanwhile, fourth light L4 that is external light having passed through the reflective panel 200 and incident on the display panel 100 corresponding to the non-pixel panel NPA is passed through the phase delay plate 150 and absorbed by the polarizing plate 160 even though it is reflected by the organic light emitting element 140 after passing through the polarizing plate 160 and the phase delay plate 150 so that reflection of external light due to the display panel 100 can be suppressed. Accordingly, a non-pixel area NPA disposed between neighboring pixel areas PA among the plurality of pixel areas PA is recognized as a black color by the user so that the contrast ratio of the image display by the reflective panel 200 can be improved.

As described, the display device according to the exemplary embodiment can display image an image with a black color generated from the color of the charged particles 250 and absorption of external light only using the reflective panel 200. Accordingly, power consumption for driving the display panel 100 can be reduced. This can improve the life-span of the display panel 100 and the display device can be improved.

Furthermore, when the above-stated driving is selectively performed for each pixel area PA, a color of the charged particles 250, a color emitted from the organic emission layer 720, and a black color realized by the phase delay plate 150 and the polarizing plate 160 can be selectively recognized by a user for each pixel area PA so that the display device can be driven corresponding to an environment having various illumination levels, i.e., inside or outside a building.

By way of summation and review, a display device with a plurality of panels having different functions may be layered for a predetermined purpose. In the display device, there may be a first display panel with a reflective panel that selectively reflects external light using liquid crystals and a second display panel that displays an image. However, while light emitted from the display panel is passed through the reflective panel, the display device has deterioration in luminance caused by liquid crystals included in the reflective panel.

In contrast, embodiments are directed to a display device that can suppress deterioration of luminance even when the display device includes a reflective panel that selectively reflects external light.

Exemplary embodiments have been disclosed herein, and although specific terms are employed, they are used and are to be interpreted in a generic and descriptive sense only and not for purpose of limitation.

What is claimed is:

1. A display device for displaying an image to a user, the display device comprising:
   a display panel including a plurality of pixels for forming the image and a non-pixel area between neighboring pixel areas among a plurality of pixel areas, the display panel being configured to display the image in an upward direction from an upper surface that faces the user; and
   a reflective panel on the upper surface of the display panel, the reflective panel configured to selectively transmit or reflect light with respect to an area corresponding to the image, the reflective panel including:
   a first transparent electrode corresponding to a pixel area;
   a neighboring electrode that neighbors the first transparent electrode and corresponds to a non-pixel area;
   a second transparent electrode corresponding to the pixel area, the second transparent electrode being arranged opposite to the first transparent electrode;
   a space interposed between the first transparent electrode and the second transparent electrode; and
   charged particles in the space, the charged particles reflecting light,
   wherein when an electric field is a lied to the first transparent electrode and the second transparent electrode, the charged particles are located in a second transparent electrode side corresponding to the first transparent electrode and the second transparent electrode and light incident to the reflective panel passes through a portion of the reflective panel and is received by the non-pixel area of the display panel.

2. The display device as claimed in claim 1, wherein the display panel includes a phase delay plate and a polarizing plate that are sequentially layered in the upward direction on a path through which the image is displayed.

3. The display device as claimed in claim 1, wherein, when an electric field is applied to the neighboring electrode and the second transparent electrode, the charged particles are located in a neighboring electrode side corresponding to the neighboring electrode and the second transparent electrode.

4. The display device as claimed in claim 1, wherein the display panel further includes an organic light emitting element that emits light corresponding to a pixel area to form the image.

5. The display device as claimed in claim 1, wherein, when an electric field is applied to the first transparent electrode and the second transparent electrode:
- the charged particles overlap the pixel area of the display panel, and
- the charged particles do not overlap the non-pixel area of the display panel.

6. The display device as claimed in claim 1, wherein:
- the first transparent electrode and the neighboring electrode are on a first substrate and are spaced apart from each other horizontally along the first substrate,
- the second transparent electrode is on a second substrate opposite the first substrate, and
- the second substrate is between the user and the first substrate.

7. The display device as claimed in claim 1, wherein the second transparent electrode extends continuously over the first transparent electrode and the neighboring electrode.

* * * * *